United States Patent
Nishibe et al.

(10) Patent No.: US 6,750,518 B2
(45) Date of Patent: Jun. 15, 2004

(54) SEMICONDUCTOR DEVICE

(75) Inventors: Eiji Nishibe, Gunma (JP); Suichi Kikuchi, Gunma (JP); Masaaki Momen, Ojiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/215,187

(22) Filed: Aug. 9, 2002

(65) Prior Publication Data
US 2003/0030105 A1 Feb. 13, 2003

(30) Foreign Application Priority Data
Aug. 9, 2001 (JP) ........................................ 2001-241900

(51) Int. Cl.[7] .............................................. H01L 29/76
(52) U.S. Cl. ........................ 257/401; 257/411
(58) Field of Search .................................. 257/401, 411

(56) References Cited

U.S. PATENT DOCUMENTS

| | | | | |
|---|---|---|---|---|
| 3,427,514 A | * | 2/1969 | Olmstead et al. | 257/401 |
| 3,449,648 A | * | 6/1969 | Beale et al. | 257/401 |
| 2001/0038097 A1 | * | 11/2001 | Inoue | 257/57 |

* cited by examiner

*Primary Examiner*—Mark V. Prenty
(74) *Attorney, Agent, or Firm*—Morrison & Foerster LLP

(57) ABSTRACT

A die size is reduced in a semiconductor device which has a gate electrode formed on a first gate insulation film and a second gate insulation film, source and drain regions (N− layers and N+ layers) formed adjacent to the gate electrode and a channel region, wherein at least the gate electrode, the channel region and the source and drain regions are polygonal in shape.

6 Claims, 2 Drawing Sheets

SEMICONDUCTOR DEVICE

BACKGROUND OF THE INVENTION

This invention relates to a semiconductor device, specifically to a semiconductor device preventing a weak inversion leakage current while minimizing a die size.

FIG. 3 and FIG. 4 are a cross-sectional view and a top view illustrating a prior art device.

A gate electrode 55 is disposed on a first gate insulation film 53 and a second gate insulation film 54, which is thicker than the first gate insulation film 53, formed in areas other than areas of a device isolation film 52 on a semiconductor substrate 51 of a first conductivity e.g. P-type, as shown in the figures.

Low impurity concentration N-type source and drain regions (N− layers, drift layers) 56 and 57 are disposed adjacent to the gate electrode 55 through the second gate insulation film 54.

High impurity concentration N-type source and drain regions (N+ layers) 58 and 59 are disposed between the second gate insulation film 54 and the device isolation film 52.

Together with a channel region 60, which is a surface region of the semiconductor substrate 51 between the source and drain regions 56 and 57 under the first gate insulation film 53, the structure described above makes a so-called LOCOS offset-type semiconductor device.

A conventional transistor is basically shaped like a rectangle. It requires convex regions (shaded regions in FIG. 4) protruding from the N-layers 56 and 57 as shown in FIG. 4, in order to suppress a weak inversion leakage current.

A width S2 of a minimum transistor of the prior art is increased by a width of the convex regions required to suppress the weak inversion leakage current.

Thus, the size of a transistor in a high voltage logic circuitry becomes larger than that required for a driving capacity, resulting in an increased die size.

SUMMARY OF THE INVENTION

A semiconductor device of this invention is directed to solve the problem addressed above. A gate electrode formed on a substrate of a first conductivity through a gate insulation film and source and drain regions of an opposite conductivity formed adjacent to the gate electrode are polygonal in shape.

The gate electrode and the source and drain regions can also be octagonal in shape.

DETAILED DESCRIPTION OF THE INVENTION

Figure 1:
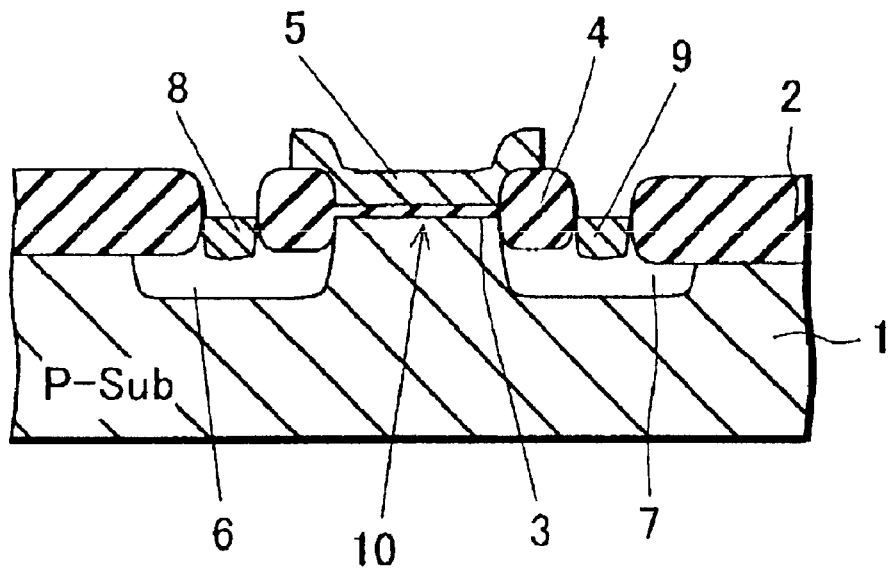
FIG. 1 shows a cross-sectional view of a semiconductor device of an embodiment of the invention.

An embodiment of the invention will be described below referring to the drawings.

Figure 2:
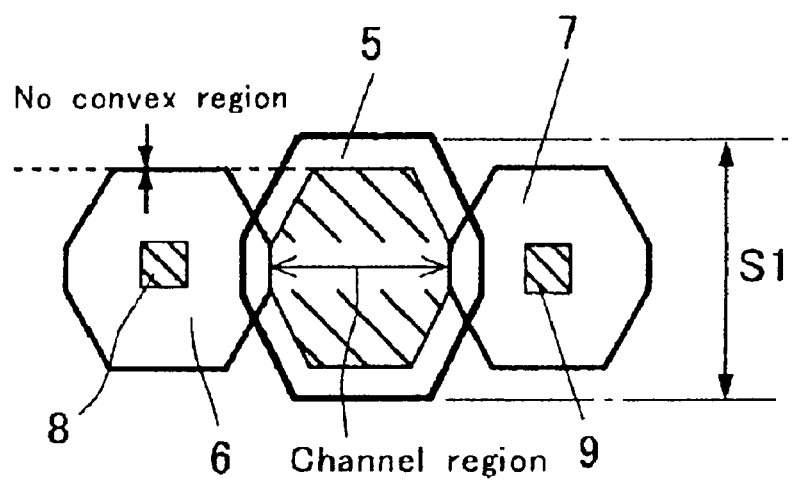
FIG. 2 shows a top view of the semiconductor device of the embodiment of the invention.
Figure 3:
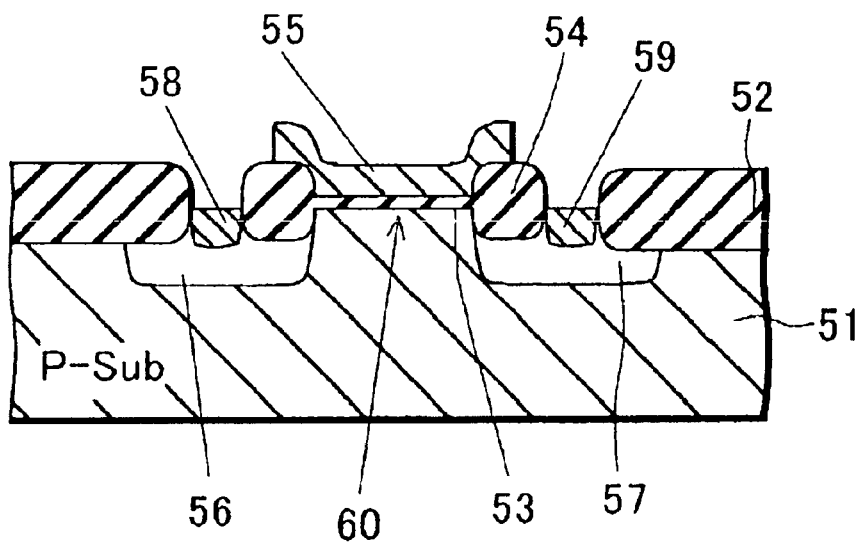
FIG. 3 shows a cross-sectional view of a conventional semiconductor device.
Figure 4:
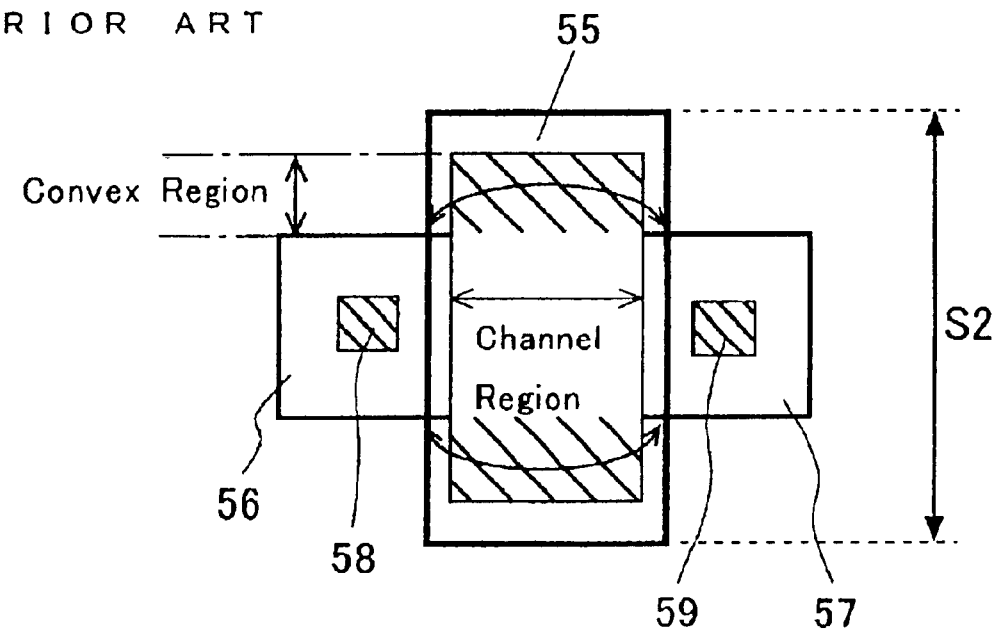
FIG. 4 shows a top view of the conventional semiconductor device.

FIG. 1 and FIG. 2 are a cross-sectional view and a top view illustrating a semiconductor device of the invention.

A gate electrode 5 is disposed on a first gate insulation film 3 and a second gate insulation film 4, which is thicker than the first gate insulation film 3, formed in areas other than areas of a device isolation film 2 on a semiconductor substrate 1 of a first conductivity e.g. P-type, as shown in the figures. The gate electrode 5 is preferably made of polysilicon. The first gate insulation film 3 is preferably made of 44 nm thick $SiO_2$. The second gate insulation film 4 is preferably made of 175 nm thick $SiO_2$. The device isolation film 2 is preferably made of 800 nm thick $SiO_2$. The semiconductor substrate 1 is made of silicon, having an impurity concentration of $1\times10^{15}/cm^3$.

Low impurity concentration N-type source and drain regions (N− layers, drift layers) 6 and 7 are disposed adjacent to the gate electrode 5 through the second gate insulation film 4. An impurity concentration in the N-layers is $1\times10^{17}/cm^3$.

High impurity concentration N-type source and drain regions (N+ layers) 8 and 9 are disposed between the second gate insulation film 4 and the device isolation film 2. An impurity concentration in the N+ layers is $1\times10^{20}/cm^3$.

Together with a channel region 10, which is a surface region of the semiconductor substrate 1 between the source and drain regions 6 and 7 under the first gate insulation film 3, the structure described above makes a so-called LOCOS offset-type semiconductor device.

A transistor of this invention is formed to be polygonal (octagonal in the embodiment) in shape as shown in FIG. 2.

According to this invention, the regions (shaded regions in FIG. 2) required to suppress the weak inversion leakage current, which correspond to the convex regions in the prior art device, are provided without increasing the size of the transistor, by forming each of the gate electrode 5, the channel region 10 and the low impurity concentration source and drain regions (N− layers) 6 and 7 in polygonal (octagonal in the embodiment) forms. Also the high impurity concentration N-type source drain regions (N+ layers) 8 and 9 may be formed in polygonal (octagonal in the embodiment) shapes.

A width S1 of a minimum size transistor of this invention is smaller than a width S2 of a minimum size transistor of the prior art. Thereby, it is possible to design a high voltage logic circuitry with minimum size transistors required for a driving capacity.

A density of the transistors can also be increased with this invention, resulting in a further reduction in die size.

Furthermore, higher withstand voltage is attained, since the angle of each corner of the transistor is widened from 90 degrees to 135 degrees, for example, leading to a reduction in electric field concentration at the corner.

This invention can be applied not only to the LOCOS offset-type semiconductor device described in the embodiment, but also to semiconductor devices of various other structures.

What is claimed is:

1. A semiconductor device comprising:
   a semiconductor substrate of a first conductivity type;
   a gate insulation film formed on the semiconductor substrate;
   a gate electrode formed on the gate insulation film;
   source and drain regions of a second conductivity type formed adjacent to the gate electrode; and
   a channel region formed between the source and drain regions, wherein the gate electrode, the channel region under the gate electrode and the source and drain regions are polygonal in shape and have more than four sides.

2. A semiconductor device comprising:

a semiconductor substrate of a first conductivity type;

a gate insulation film formed on the semiconductor substrate;

a gate electrode formed on the gate insulation film; and source and drain regions of a second conductivity type formed adjacent to the gate electrode, wherein the gate electrode and the source and drain regions are octagonal in shape such that none of the interior angles of the octagons is larger than 180 degrees.

3. A semiconductor device comprising:

a semiconductor substrate of a first conductivity type;

a gate insulation film formed on the semiconductor substrate;

an octagonal gate electrode formed on the gate insulation film;

a source region of a second conductivity type formed on a first side of the octagonal gate electrode;

a drain region of the second conductivity type formed on a second side of the octagonal gate electrode opposite to the first side; and an octagonal channel region formed under the octagonal gate electrode and between the source and drain regions.

4. The semiconductor device of claim 1, further comprising an additional gate insulation film that surrounds and is thicker than the gate insulating film on which the polygonal gate electrode is formed.

5. The semiconductor device of claim 2, further comprising an additional gate insulation film that surrounds and is thicker than the gate insulating film on which the octagonal gate electrode is formed.

6. The semiconductor device of claim 3, further comprising an additional gate insulation film that surrounds and is thicker than the gate insulating film on which the octagonal gate electrode is formed.

* * * * *